(12) United States Patent
Nakao

(10) Patent No.: US 7,781,066 B2
(45) Date of Patent: *Aug. 24, 2010

(54) MULTILAYER CERAMIC SUBSTRATE, METHOD FOR PRODUCING SAME, AND COMPOSITE GREEN SHEET FOR FORMING MULTILAYER CERAMIC SUBSTRATE

(75) Inventor: Shuya Nakao, Higashiomi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 108 days.

This patent is subject to a terminal disclaimer.

(21) Appl. No.: 11/765,517

(22) Filed: Jun. 20, 2007

(65) Prior Publication Data

US 2007/0248801 A1    Oct. 25, 2007

Related U.S. Application Data

(63) Continuation of application No. PCT/JP2006/312302, filed on Jun. 20, 2006.

(30) Foreign Application Priority Data

Jul. 1, 2005    (JP)    ............................. 2005-194147
Apr. 28, 2006    (JP)    ............................. 2006-124763

(51) Int. Cl.
  B32B 17/06    (2006.01)
  B32B 15/00    (2006.01)
  B32B 9/00    (2006.01)
  B32B 19/00    (2006.01)
(52) U.S. Cl. ........................ 428/426; 428/432; 428/701; 428/702
(58) Field of Classification Search ... 156/89.11–89.28; 428/426, 432, 701, 702
See application file for complete search history.

(56) References Cited

U.S. PATENT DOCUMENTS 5,085,720 A    2/1992    Mikeska et al.

(Continued)

FOREIGN PATENT DOCUMENTS

JP    04-243978 A    9/1992

(Continued)

OTHER PUBLICATIONS

Official Communication for PCT Application No. PCT/JP2006/312302; mailed Sep. 12, 2006.

(Continued)

Primary Examiner—Timothy M Speer
Assistant Examiner—Jonathan C Langman
(74) Attorney, Agent, or Firm—Keating & Bennett, LLP

(57) ABSTRACT

A multilayer ceramic substrate includes a base layer made of an aggregate of a first powder including a glass material and a first ceramic material, a constraining layer made of an aggregate of a second powder including a second ceramic material that is not sintered at a temperature at which the glass material melts, an intermediate layer made of an aggregate of a third powder including a viscosity-reducing material that reduces the viscosity of the melt of the glass material, and a conductive film disposed along at least one main surface of the base layer, the constraining layer, and the intermediate layer. The intermediate layer is arranged such that one main surface thereof is in contact with the base layer and the other main surface thereof is in contact with the constraining layer. At least a portion of the first powder is in a sintered state. The second powder is in an unsintered state, and particles of the second powder are bonded to each other by diffusion or flow of a portion of the first powder including the glass material and a portion of the third powder into the constraining layer.

13 Claims, 8 Drawing Sheets

U.S. PATENT DOCUMENTS

| | | | |
|---|---|---|---|
| 5,254,191 | A | 10/1993 | Mikeska et al. |
| 5,387,474 | A | 2/1995 | Mikeska et al. |
| 5,474,741 | A | 12/1995 | Mikeska et al. |
| 6,036,798 | A * | 3/2000 | Nishide et al. ............ 156/89.12 |
| 6,306,511 | B1 | 10/2001 | Nakao et al. |
| 6,432,239 | B1 | 8/2002 | Mandai et al. |
| 6,468,640 | B2 * | 10/2002 | Nishide et al. .............. 428/210 |
| 6,517,924 | B1 | 2/2003 | Kameda et al. |
| 6,588,097 | B2 | 7/2003 | Nishide et al. |
| 6,743,534 | B2 | 6/2004 | Lautzenhiser et al. |
| 2002/0157760 | A1 | 10/2002 | Mandai et al. |
| 2003/0168150 | A1 * | 9/2003 | Lee et al. ................. 156/89.12 |
| 2003/0211302 | A1 | 11/2003 | Mandai et al. |

FOREIGN PATENT DOCUMENTS

| | | | |
|---|---|---|---|
| JP | 5-503498 | A | 6/1993 |
| JP | 2000-025157 | A | 1/2000 |
| JP | 2000-315864 | A | 11/2000 |
| JP | 2001-030419 | A | 2/2001 |
| JP | 2002-160980 | * | 6/2002 |
| JP | 2002-198647 | A | 7/2002 |
| JP | 2004-200679 | A | 7/2004 |
| JP | 2006-173422 | A | 6/2006 |

OTHER PUBLICATIONS

Nakao; "Multilayer Ceramic Substrate, Method for Making the Same, and Composite Green Sheet for Making Multilayer Ceramic Substrate"; U.S. Appl. No. 11/691,867, filed Mar. 27, 2007.

* cited by examiner

MULTILAYER CERAMIC SUBSTRATE, METHOD FOR PRODUCING SAME, AND COMPOSITE GREEN SHEET FOR FORMING MULTILAYER CERAMIC SUBSTRATE

BACKGROUND OF THE INVENTION

1. Field of the Invention

The present invention relates to a multilayer ceramic substrate, a method for producing the multilayer ceramic substrate, and composite green sheets for forming the multilayer ceramic substrate. In particular, the present invention relates to a multilayer ceramic substrate produced by a zero-shrinkage process, a method for producing the multilayer ceramic substrate, and composite green sheets for forming the multilayer ceramic substrate.

2. Description of the Related Art

For example, Japanese Unexamined Patent Application Publication No. 2000-25157 (Patent Document 1) discloses a multilayer ceramic substrate that is related to the present invention. Patent Document 1 discloses a composite laminate and a method for producing the composite laminate by a zero-shrinkage process. More specifically, Patent Document 1 discloses the composite laminate which can be produced while shrinkage due to firing is inhibited and which can be used in an as-fired state, and a method for producing the composite laminate. As a preferred example, a multilayer ceramic substrate having a structure described below and a method for producing the multilayer ceramic substrate are disclosed.

The multilayer ceramic substrate includes a base layer made of an aggregate of a first powder including a first ceramic material and a glass material, and a constraining layer made of an aggregate of a second powder containing a second ceramic material that is not sintered at a temperature at which the glass material is melted. At least a portion of the first powder is in a sintered state. The second powder is in an unsintered state. Particles of the second powder are bonded to each other by diffusion or flow of a portion of the first powder including the glass material into the constraining layer.

To produce such a multilayer ceramic substrate, a green laminate including a green base layer including the first powder and green constraining layer including the second powder is formed. Then, the green laminate is fired. In the firing step, at least a portion of the second powder is sintered. Furthermore, in the firing step, a portion of the first powder, typically, a portion of the glass material included in the second powder diffuses or flows into the constraining layer. Thus, although the second powder is not sintered, the particles thereof are bonded to each other by a portion of the first powder, in particular, by the glass material.

According to the above-described production method, since the second powder is not sintered during the firing step, the constraining layer including the second powder has the effect of inhibiting the shrinkage of the base layer to inhibit the shrinkage of the entirety of the multilayer ceramic substrate due to firing, thereby reducing a variations in dimensions of the resulting multilayer ceramic substrate. Furthermore, in the resulting multilayer ceramic substrate, the particles of the second powder included in the constraining layer are bonded to each other by diffusion or flow of a portion of the second powder including the glass material, thus eliminating the need to remove the constraining layer later.

However, when the technique described in Patent Document 1 is utilized, disadvantageously, the glass material does not always sufficiently penetrate into the constraining layer, depending on the type of glass material included in the base layer. The main reason for the problem may be that when the glass material melts, the glass material has high viscosity and thus has low fluidity.

To solve this problem, a low-viscosity glass material is used. However, when the low-viscosity glass is selected, for example, when capacitance is formed between the base layers, the base layers have an excessively low dielectric constant. Thus, disadvantageously, target capacitance cannot always be obtained. In other words, selecting a glass material having low viscosity and satisfying electrical properties required and adjusting the composition of the glass material require a lot of time and are often technically difficulty.

On the other hand, the thickness of the constraining layer has been reduced in order to solve the problem of the insufficient penetration of the glass material into the constraining layer. However, at a reduced thickness of the constraining layer, the shrinkage-inhibiting effect of the constraining layer is degraded, thereby disadvantageously causing the occurrence of warpage of the resulting multilayer ceramic substrate.

SUMMARY OF THE INVENTION

Preferred embodiments of the present invention provide a multilayer ceramic substrate which overcomes the problems described above, and a method for producing the multilayer ceramic substrate.

Preferred embodiments of the present invention provide composite green sheets for forming the multilayer ceramic substrate, the composite green sheets being used in the method for producing the multilayer ceramic substrate.

A multilayer ceramic substrate according to a preferred embodiment of the present invention includes a base layer made of an aggregate of a first powder including a glass material and a first ceramic material, a constraining layer made of an aggregate of a second powder including a second ceramic material that is not sintered at a temperature at which the glass material melts, and an intermediate layer made of an aggregate of a third powder including a viscosity-reducing material that functions to reduce the viscosity of the melt of the glass material. The multilayer ceramic substrate further includes a conductive film disposed along at least one main surface of the base layer, the constraining layer, and the intermediate layer.

The intermediate layer is positioned such that one main surface thereof is in contact with the base layer and the other main surface thereof is in contact with the constraining layer. At least a portion of the first powder is in a sintered state. The second powder is in an unsintered state. Particles of the second powder are bonded to each other by diffusion or flow of a portion of the first powder including the glass material and a portion of the third powder into the constraining layer.

Specifically, the viscosity-reducing material may include an oxide of a transition element. Alternatively, the viscosity-reducing material may include a low-viscosity glass material and/or a low-melting-point glass material.

Preferably, a portion of the glass material included in the base layer diffuses or flows into the entirety of the constraining layer, and all of the particles of the second powder are bonded to each other by the portion of the glass material.

The glass material included in the base layer may include a vitrified portion before a firing step of sintering at least a portion of the first powder. Alternatively, the glass material may include a portion melted and vitrified through the firing step of sintering at least a portion of the first powder.

Preferably, the glass material is not crystallized.

The multilayer ceramic substrate according to this preferred embodiment of the present invention may include a plurality of base layers and have a laminated structure portion in which the intermediate layer, the constraining layer, and the intermediate layer are stacked in that order, each being disposed between adjacent base layers in the stacking direction. Alternatively, the multilayer ceramic substrate may include a plurality of constraining layers and have a laminated structure portion in which the intermediate layer, the base layer, and the intermediate layer are stacked in that order, each being disposed between adjacent constraining layers in the stacking direction. In the case where the multilayer ceramic substrate includes the plurality of the base layers, preferably, the contents of the glass material of the base layers between which the intermediate layer, the constraining layer, and the intermediate layer are interposed are substantially the same per unit volume, the base layers being adjacent in the stacking direction.

In the multilayer ceramic substrate according to this preferred embodiment of the present invention, the constraining layer preferably has a thickness less than that of the base layer.

Furthermore, the present invention is advantageously applied to the multilayer ceramic substrate further including a cavity having an opening positioned at least along one main surface of the multilayer ceramic substrate.

In the multilayer ceramic substrate according to preferred embodiments of the present invention, preferably, the absolute value of the difference in thermal expansion coefficient between the base layer and the intermediate layer is about 2.0 ppm/° C. or less, and the absolute value of the difference in thermal expansion coefficient between the constraining layer and the intermediate layer about 2.0 ppm/° C. or less.

Another preferred embodiment of the present invention also provides a method for producing a multilayer ceramic substrate. The method according to this preferred embodiment of the present invention for producing the multilayer ceramic substrate includes a laminate-forming step and a firing step.

In the laminate-forming step, a green laminate is formed, the green laminate including a green base layer including a first powder that that includes a first ceramic material and a glass material or a glass component that melts and vitrifies by firing to form the glass material, a green constraining layer including a second powder including a second ceramic material that is not sintered at a temperature at which the glass material melts, a green intermediate layer including a third powder including a viscosity-reducing material that functions to reduce the viscosity of the melt of the glass material, and a conductive film disposed along at least one main surface of the base layer, the constraining layer, and the intermediate layer, the intermediate layer being positioned such that one main surface of the intermediate layer is in contact with the base layer and the other main surface thereof is in contact with the constraining layer.

In the firing step, the green laminate is fired at a predetermined temperature such that while at least a portion of the first powder is sintered, particles of the second powder are bonded to each other without sintering by diffusion or flow of a portion of the first powder including the glass material and a portion of the third powder into the constraining layer.

When the viscosity-reducing material includes an oxide of a transition element, the firing step includes a substep of reducing the viscosity of the melt of the glass material by diffusing ions of the oxide of the transition element into the glass material. The reason for the decrease in the viscosity of the glass material is that the ions of the oxide of the transition element cut the cross-linking between oxygen atoms in the glass material.

When the viscosity-reducing material includes a low-viscosity glass material and/or a low-melting-point glass material, the firing step includes a substep of reducing the viscosity of the melt of the glass material by incorporating the low-viscosity glass material and/or the low-melting-point glass material into the glass material included in the base layer.

In the firing step, preferably, a portion of the glass material included in the base layer diffuses or flows into the entirety of the constraining layer to bond all particles of the second powder to each other.

When the green base layer includes the glass component capable of being melted and vitrified by firing to form the glass material, in the firing step, the glass component is melted and vitrified.

Preferably, the glass material or the glass component that is melted and vitrified by firing to form the glass material is not crystallized.

When the green laminate includes a plurality of the base layers, and the intermediate layer, the constraining layer, and the intermediate layer are stacked in that order, each being disposed between adjacent base layers in the stacking direction, preferably, the thickness of each of the base layers is set such that after the firing step, contents of the glass material of the base layers between which the intermediate layer, the constraining layer, and the intermediate layer are interposed are substantially the same per unit volume, the base layers being adjacent in the stacking direction.

When the green laminate includes a via-hole conductor electrically connected to the conductive film and provided so as to pass through a specific base layer in the thickness direction, preferably, the green laminate further includes the shrinkage-constraining layer disposed on each main surface of the green laminate and having substantially the same composition as the constraining layer. In this case, a step of removing an unsintered shrinkage-constraining layer after the firing step is further performed.

When the via-hole conductor includes a via-hole conductor provided in the endmost base layer of the green laminate in the stacking direction, a preferred embodiment in which the above-described shrinkage-constraining layers are used is advantageously applied.

Preferably, in the green laminate, the base layer is in contact with the shrinkage-constraining layer.

In the method according to preferred embodiments of the present invention for producing the multilayer ceramic substrate, after the firing step, the absolute value of the difference in thermal expansion coefficient between the base layer and the intermediate layer is about 2.0 ppm/° C. or less, and the absolute value of the difference in thermal expansion coefficient between the constraining layer and the intermediate layer is about 2.0 ppm/° C. or less.

Another preferred embodiment of the present invention also provides a composite green sheet for forming a multilayer ceramic substrate.

According to a preferred embodiment, a composite green sheet for forming a multilayer ceramic substrate according to the present invention includes a green base layer including a powder that includes a ceramic material and a glass material or a glass component capable of being melted and vitrified by firing to form the glass material, and a green intermediate layer disposed on the base layer, the intermediate layer including a powder including a viscosity-reducing material that functions to reduce the viscosity of the melt of the glass material.

According to another preferred embodiment, a composite green sheet includes a green base layer including a first powder that includes a first ceramic material and a glass material or a glass component capable of being melted and vitrified by firing to form the glass material, a green constraining layer including a second powder including a second ceramic material that is not sintered at a temperature at which the glass material melts, and a green intermediate layer including a third powder including a viscosity-reducing material that functions to reduce the viscosity of the melt of the glass material, wherein the intermediate layer is positioned such that one main surface of the intermediate layer is in contact with the base layer and the other main surface is in contact with the constraining layer.

According to another preferred embodiment, a composite green sheet includes a green base layer including a first powder that includes a first ceramic material and a glass material or a glass component capable of being melted and vitrified by firing to form the glass material, a green constraining layer including a second powder including a second ceramic material that is not sintered at a temperature at which the glass material melts, and a green intermediate layer including a third powder including a viscosity-reducing material that functions to reduce the viscosity of the melt of the glass material, wherein a first base layer, a first intermediate layer, the constraining layer, a second intermediate layer, and a second base layer are stacked in that order.

According to preferred embodiments of the present invention, since the intermediate layer is disposed between the base layer and the constraining layer, the glass material included in the base layer is in contact with the viscosity-reducing material included in the intermediate layer. Thus, in the firing step, a portion of the viscosity-reducing material included in the intermediate layer is eluted or mixed with the glass material included in the base layer, reducing the viscosity of the glass material. Thereby, the glass material smoothly penetrates into the constraining layer through the intermediate layer.

Thus, the glass material can sufficiently penetrate into the constraining layer without a decrease in the thickness of the constraining layer, such that the constraining effect of the constraining layer during firing is sufficient. There is no need to increase the firing temperature in order to reduce the viscosity of the glass material. Thus, the firing temperature can be set at a relatively low temperature. Thereby, the deformation, such as warpage, of the multilayer ceramic substrate does not readily occur. Furthermore, there is no need to use a glass material having low viscosity but having poor electrical properties as the glass material included in the base layer. Therefore, the multilayer ceramic substrate surely has satisfactory electrical properties. Furthermore, there is a wide choice of glass materials that can be included in the base layer.

According to preferred embodiments of the present invention, similar to Patent Document 1, since the second powder including the second ceramic material is not sintered, the constraining layer including the second powder has the effect of inhibiting the shrinkage of the base layer to inhibit the shrinkage of the entirety of the multilayer ceramic substrate due to firing, thereby inhibiting undesirable deformation and reducing a variations in dimensions of the resulting multilayer ceramic substrate. Furthermore, the second powder included in the constraining layer is in an unsintered state. However, the particles of the second powder are bonded to each other by diffusion or flow of a portion of the first powder including the glass material and a portion of the third powder into the constraining layer. Thus, the constraining layer can be used in an as-is condition and need not to be removed later.

In particular, the variations in the dimensions of a multilayer ceramic substrate including a cavity occur easily. Thus, the present invention is more advantageously applied to the multilayer ceramic substrate having the cavity and a method for producing the multilayer ceramic substrate. Furthermore, when the present invention is applied to the multilayer ceramic substrate having the cavity, a strain around the cavity is reduced.

In preferred embodiments of the present invention, a portion of the glass material included in the base layer diffuses or flows into the entirety of the constraining layer. All of the particles of the second powder are bonded to each other by a portion of the glass material. In this case, the multilayer ceramic substrate has high mechanical strength.

When the glass material included in the base layer is not crystallized, it is possible to inhibit an increase in viscosity due to the crystallization of the glass material. Furthermore, it is possible to prevent the inhibition of diffusion or flow into the constraining layer due to crystallization. When an oxide of a transition element is used as the viscosity-reducing material, when the glass material is crystallized, the oxide of the transition element has the effect of promoting the crystallization of the glass material. Thus, when the glass material is not crystallized, the oxide of the transition element can be used as the viscosity-reducing material without problems.

When the multilayer ceramic substrate includes a plurality of base layers and has a laminated structure portion in which the intermediate layer, the constraining layer and the intermediate layer are stacked in that order, each being disposed between adjacent base layers in the stacking direction, when contents of the glass material of the base layers between which the intermediate layer, the constraining layer and the intermediate layer are interposed are substantially the same per unit volume, the base layers being adjacent in the stacking direction, a good balance between amounts of the glass material penetrated from adjacent base layers in the stacking direction to the constraining layer disposed therebetween is ensured. Thus, in the firing step, amounts of the shrinkage of the base layers are substantially the same. Therefore, it is possible to more securely inhibit the occurrence of warpage of the resulting multilayer ceramic substrate.

When the constraining layer has a thickness less than that of the base layer, the glass material included in the base layer more easily diffuses or flows into the entirety of the constraining layer.

In the method according to preferred embodiments of the present invention for producing the multilayer ceramic substrate, when the green laminate includes the via-hole conductor and the shrinkage-constraining layer disposed on each main surface of the green laminate, the warpage, which may occur in the firing step, of the multilayer ceramic substrate is further prevented. Each of the shrinkage-constraining layers having a greater thickness results in an increase in the effect of inhibiting the warpage.

In preferred embodiments of the present invention, in the firing step, the shrinkage of the multilayer ceramic substrate in the direction of a main surface thereof is inhibited. Thus, a greater amount of shrinkage in the stacking direction occurs. On the other hand, the via-hole conductor is primarily composed of a conductive component, thus resulting in a relatively low rate of shrinkage in the firing step. As a result, the multilayer ceramic substrate disadvantageously may have a protrusion on a surface thereof after firing because of the presence of the via-hole conductor. The above-described shrinkage-constraining layers also have the effect of inhibiting the occurrence of the protrusion due to the via-hole conductor.

When the via-hole conductor is provided in the endmost base layer of the green laminate in the stacking direction, the protrusion occurs more readily. Thus, the effect of the shrinkage-constraining layer is more significantly exerted.

In the green laminate, when the base layer is in contact with the shrinkage-constraining layer without the intermediate layer, the glass material does not easily diffuse or flow into the shrinkage-constraining layer. After the firing step, the shrinkage-constraining layer is easily removed. Furthermore, conductive films are formed on a main surface of the base layer facing the outside without problems.

In preferred embodiments of the present invention, when the absolute value of the difference in thermal expansion coefficient between the base layer and the intermediate layer is about 2.0 ppm/° C. or less, and when the absolute value of the difference in thermal expansion coefficient between the constraining layer and the intermediate layer is about 2.0 ppm/° C. or less, for example, a stress remaining in a cooling step after the firing step is reduced, thereby inhibiting the occurrence of a structural defect, such as a crack, caused by the stress and improving the reliability of the multilayer ceramic substrate.

According to the composite green sheet for forming the multilayer ceramic substrate in accordance with preferred embodiments of the present invention, the green laminate for forming the multilayer ceramic substrate is efficiently produced.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 14A is an elevation view showing a cross section of the multilayer ceramic substrate, and FIG. 14B is a bottom plan view of the multilayer ceramic substrate.

FIG. 17A is a cross-sectional view taken along line A-A shown in FIG. 17B or 17C, FIG. 17B is a cross-sectional view taken along line B-B shown in FIG. 17A, and FIG. 17C is a cross-sectional view taken along line C-C shown in FIG. 17A.

DETAILED DESCRIPTION OF PREFERRED EMBODIMENTS

Figure 1:
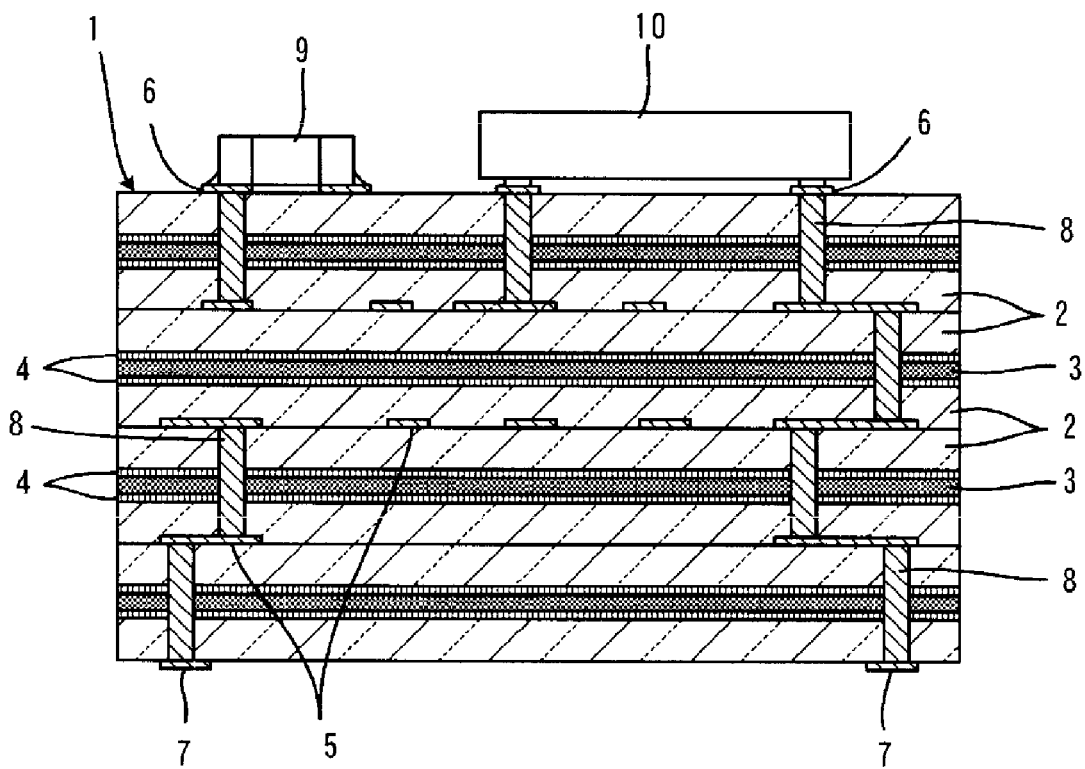
FIG. 1 is a cross-sectional view diagrammatically illustrating a multilayer ceramic substrate according to a first preferred embodiment of the present invention.

FIG. 1 is a cross-sectional view diagrammatically showing a multilayer ceramic substrate 1 according to a first preferred embodiment of the present invention. In FIG. 1, the dimension of the multilayer ceramic substrate 1 in the thickness direction is exaggerated.

The multilayer ceramic substrate 1 has a multilayer structure including base layers 2, constraining layers 3, and intermediate layers 4. In this preferred embodiment, the multilayer ceramic substrate 1 has a laminated structure portion in which the intermediate layer 4, the constraining layer 3, and the intermediate layer 4 are stacked in that order, each being disposed between adjacent base layers 2 in the stacking direction. In this preferred embodiment, the multilayer ceramic substrate 1 has a laminated structure portion in which the intermediate layer 4, two base layers 2 and the intermediate layer 4 are stacked in that order, each being disposed between adjacent constraining layers 3 in the stacking direction. In this preferred embodiment, the two base layers 2 in contact with each other are shown in order to facilitate the explanation of a production method described below. In fact, the two base layers 2 are integrated.

The base layers 2 are each made of an aggregate of a first powder including a first ceramic material and a glass material. The glass material is, for example, a $SiO_2$—$CaO$—$Al_2O_3$—$MgO$—$B_2O_3$ material. A material that does not crystallize alone is advantageously used as the glass material. The first ceramic material is composed of, for example, alumina.

The constraining layers 3 are each made of an aggregate of a second powder including a second ceramic material that is not sintered at a temperature at which the glass material melts. The second ceramic material is advantageously composed of, for example, alumina.

Each of the intermediate layers 4 is made of an aggregate of a third powder including a viscosity-reducing material that functions to reduce the viscosity of the melt of the glass material. Examples of usable viscosity-reducing material include oxides of transition elements. Alternatively, a low-viscosity glass material and/or a low-melting-point glass material may be used. Preferable examples of low-viscosity glass material include $B_2O_3$-rich glass materials. Examples of usable low-melting-point glass material include $SiO_2$—$PbO$ glass materials. The effect of the viscosity-reducing material will be described in the description of a method for producing the multilayer ceramic substrate 1.

In the multilayer ceramic substrate 1, each of the intermediate layers 4 is located such that one main surface thereof is in contact with a corresponding one of the base layers 2 and the other main surface is in contact with a corresponding one of the constraining layers 3.

At least a portion of the first powder included in each base layer 2 is sintered. The second powder included in each constraining layer 3 is unsintered. However, particles of the second powder are bonded to each other by diffusion or flow of a portion of the first powder including the glass material and a portion of the third powder included in the intermediate layers 4 into the constraining layer 3.

Preferably, a portion of the glass material included in each base layer 2 diffuses or flows entirely into the constraining layers 3 to bond all of the particles of the second powder to each other. The glass material included in the base layers 2 of the multilayer ceramic substrate 1 as a final product may include a vitrified portion before a firing step in order to sinter at least a portion of the first powder or may include a portion melted and vitrified through a firing step.

In this preferred embodiment, each of the constraining layers 3 has a thickness less than that of each base layer 2.

The multilayer ceramic substrate 1 further includes wiring conductors. The wiring conductors are used for the formation of a passive element, such as a capacitor or an inductor, or connection, for example, electrical connection between elements. Typically, the multilayer ceramic substrate 1 includes some conductive films 5 to 7 and some via-hole conductors 8.

The conductive films 5 are provided in the multilayer ceramic substrate 1. In this preferred embodiment, the conductive films 5 are disposed along main surfaces of the base layers 2. However, the conductive films 5 need not necessarily be disposed at these positions. The conductive films 5 may be disposed along the constraining layers 3 or the intermediate layers 4. The conductive films 6 are disposed on one main surface of the multilayer ceramic substrate 1. The conductive films 7 are disposed on the other main surface of the multilayer ceramic substrate 1. In this preferred embodiment, both conductive films 6 and 7 are positioned on the base layers 2. Each via-hole conductor 8 is provided so as to be electrically connected to any of the conductive films 5 to 7 and pass through a specific base layer 2 in the thickness direction.

Chip components 9 and 10 are mounted on the one main surface of the multilayer ceramic substrate 1 and are electrically connected to the conductive films 6.

Figure 2:
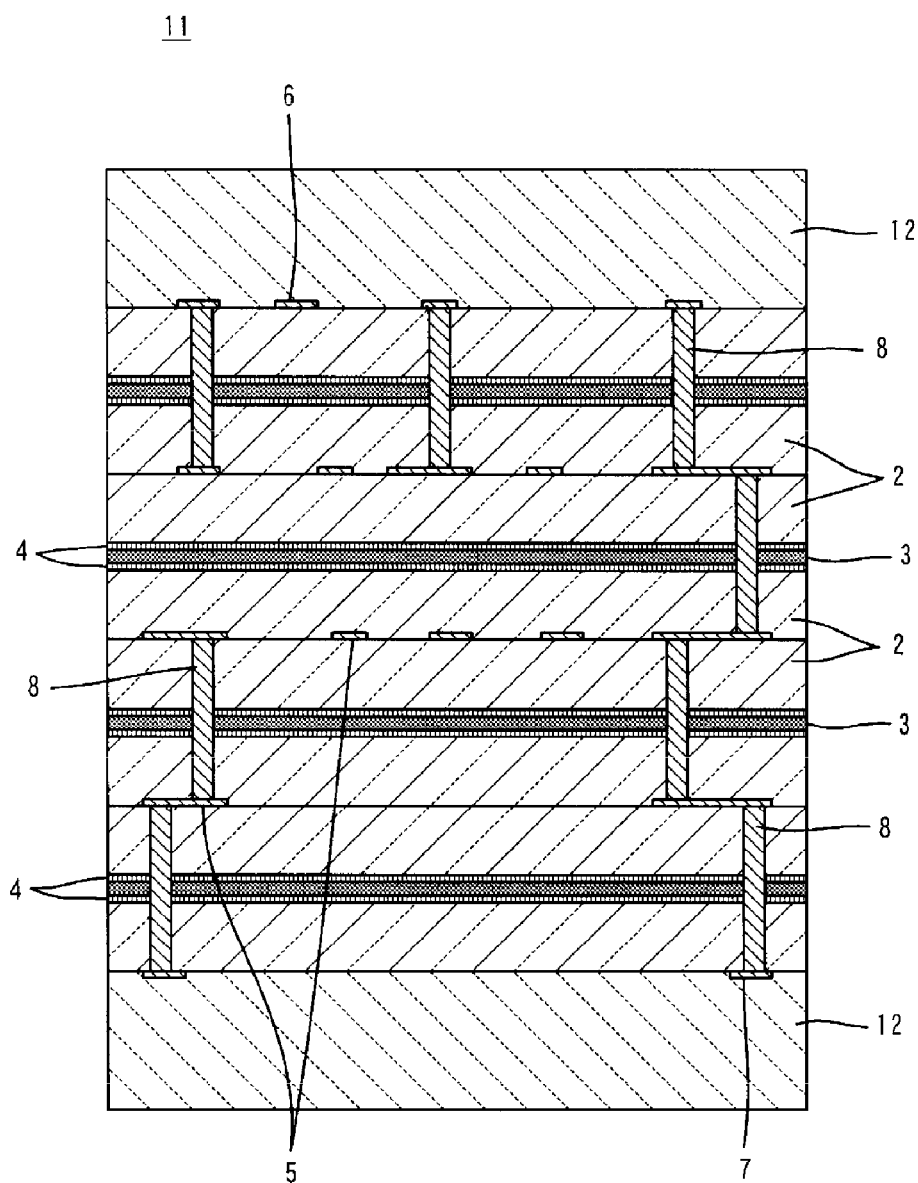
FIG. 2 is a cross-sectional view diagrammatically illustrating a green laminate for forming the multilayer ceramic substrate 1 shown in FIG. 1.

A method for producing the multilayer ceramic substrate 1 will be described below. FIG. 2 is a cross-sectional view diagrammatically illustrating a green laminate 11 for forming the multilayer ceramic substrate 1. In FIG. 2, elements that are equivalent to the elements shown in FIG. 1 are designated using the same reference numerals, and description thereof is omitted. FIG. 2 shows a green state before shrinkage due to firing occurs. In particular, each base layer 2 has a large dimension in the thickness direction as compared to that shown in FIG. 1.

The green laminate 11 includes elements corresponding to elements of the multilayer ceramic substrate 1 shown in FIG. 1. In more detail, the green laminate 11 includes the green base layers 2, the green constraining layers 3, and the green intermediate layers 4. Furthermore, when the conductive films 5 to 7 and the via-hole conductors 8 are formed by firing a conductive paste containing a conductive metal powder, the green laminate 11 includes the green conductive films 5 to 7 and the green via-hole conductors 8.

The green base layers 2 include the first powder including the first ceramic material and the glass material or the glass component capable of being melted and vitrified by firing to form the glass material. As an example, each of the green base layers 2 includes a $SiO_2$—$CaO$—$Al_2O_3$—$MgO$—$B_2O_3$ glass powder as the glass material, an alumina powder as the first ceramic material, water as a dispersion medium, a polyvinyl alcohol as a binder, and a polycarboxylic acid dispersant as a dispersant.

Each of the green constraining layers 3 includes the second powder including the second ceramic material that is not sintered at a temperature at which the glass material melts. As an example, each of the green constraining layers 3 includes an alumina powder as the second ceramic material, water as a dispersion medium, a polyvinyl alcohol as a binder, and a polycarboxylic acid dispersant as a dispersant.

Each of the green intermediate layers 4 includes the third powder including the viscosity-reducing material that functions to reduce the viscosity of the melt of the glass material. As described above, an oxide of a transition element may be used as the viscosity-reducing material. Alternatively, a low-viscosity glass material and/or a low-melting-point glass material may be used.

When the oxide of the transition element is used as the viscosity-reducing material, as an example, each of the green intermediate layers 4 includes a copper oxide powder as the oxide of the transition element, water as a dispersion medium, a polyvinyl alcohol as a binder, and a polycarboxylic acid dispersant as a dispersant.

On the other hand, when the low-viscosity glass material and/or the low-melting-point glass material is used, as an example, each of the green intermediate layers 4 includes a $B_2O_3$-rich $SiO_2$—$CaO$—$Al_2O_3$—$MgO$—$B_2O_3$ glass powder, an alumina powder, water as a dispersion medium, a polyvinyl alcohol as a binder, and a polycarboxylic acid dispersant as a dispersant. The $B_2O_3$-rich $SiO_2$—$CaO$—$Al_2O_3$—$MgO$—$B_2O_3$ glass powder is a low-viscosity glass material. Alternatively, a $SiO_2$—$PbO$ glass material may be used as the low-viscosity glass material.

A conductive paste for forming the conductive films 5 to 7 and the via-hole conductors 8 includes, for example, a Ag powder, ethyl cellulose as a binder, and a terpene as a solvent.

The green laminate 11 further includes shrinkage-constraining layers 12 each disposed on each main surface thereof. Each of the shrinkage-constraining layers 12 has substantially the same composition as that of each of the green constraining layers 3. The multilayer ceramic substrate 1 may be produced without the shrinkage-constraining layers 12. A plurality of the multilayer ceramic substrates 1 may be simultaneously produced by stacking a plurality of the green laminates 11 with the shrinkage-constraining layers 12 provided therebetween.

When the green laminate 11 is a collective laminate, the laminate is cut into pieces each having a predetermined size. Alternatively, grooves to be formed into separating lines may be formed in the green collective laminate 11. Then, the green collective laminate 11 is fired, and then the fired collective substrate may be cut along the separating lines into pieces.

A step of firing the green laminate 11 is performed. Conditions, such as, temperature conditions, in the firing step are selected such that the following state is obtained after the firing step. That is, as a result of the siring step, at least a portion of the first powder included in each base layer 2 is sintered. A portion of the first powder including the glass material included in each base layer 2 and a portion of the third powder included in each intermediate layer 4 diffuse or flow into each constraining layer 3. Thereby, particles of the second powder included in each constraining layer 3 are bonded to each other without sintering.

In the firing step, preferably, a portion of the glass material included in each base layer 2 diffuses or flows into the entirety of the constraining layers 3, thereby bonding all the particles of the second powder to one another.

In the firing step, since the second powder included in each constraining layer 3 is not sintered, each constraining layer 3 does not shrink substantially. Thus, the constraining layers 3 have the effect of inhibiting shrinkage on the base layers 2 and inhibit the shrinkage of each base layer 2 in the direction of a main surface. Furthermore, each of the shrinkage-constraining layers 12 has the effect of inhibiting shrinkage on the base layers 2, in the same manner in the constraining layers 3. Thereby, shrinkage due to firing occurs substantially only in the thickness direction of each base layer 2. Thus, undesired deformation of the resulting multilayer ceramic substrate 1 does not readily occur, thus increasing dimensional precision.

In the firing step, the viscosity-reducing material included in the intermediate layers 4 functions to reduce the viscosity of the melt of the glass material included in the base layers 2 and promotes the penetration of the glass material into the constraining layers 3.

Specifically, when the viscosity-reducing material is an oxide of a transition element, in the firing step, when the glass material included in the base layers 2 is melted and penetrated into the intermediate layers 4, ions of the oxide of the transition element diffuse into the glass material, thus reducing the viscosity of the melt of the glass material. This is because the oxide of the transition element, e.g., Cu, Fe, or Mn, functions as a network-modifying oxide in glass and cuts the cross-linking between oxygen atoms in the glass material.

A portion of the oxide of the transition element may diffuse into the glass material to reduce the viscosity of the melt of the glass material. All of the oxide of the transition element need not necessarily react. Preferably, each of the intermediate layers 4 has a reduced thickness. For example, the thickness is about 2 μm to about 5 μm. This is because an excessively large thickness of each intermediate layer 4 results in a longer time for the penetration of the glass material thereinto.

Each of the intermediate layers 4 may include the amount of the oxide of the transition element required for a reduction in the viscosity of the glass material. For example, when the third powder is a powder including about 5 percent by weight of CuO as the oxide of the transition element and about 95 percent by weight of alumina, the effect of improving the penetration of the glass material is sufficiently provided. However, a powder including 100 percent by weight of CuO is more preferred as the third powder because the smallest thickness of each intermediate layer 4 is provided.

When Cu is used as the transition element, a CuO powder preferably has a particle size of about 0.1 μm to about 3 μm. At a particle size of less than about 0.1 μm, particles that do not diffuse into the glass material have an excessively small particle size, thus reducing the penetration velocity of the glass material. A particle size exceeding about 3 μm results in a reduction in contact area between the powder and the glass material to reduce the amount of diffusion, such that the viscosity is not easily reduced.

When a low-viscosity glass material such as a $B_2O_3$-rich glass material and/or a low-melting-point glass material such as a $SiO_2$—PbO glass material is used as the viscosity-reducing material, in the firing step, the low-viscosity glass material and/or the low-melting-point glass material are incorporated into the glass material included in the base layers 2 and thus functions to physically reduce the viscosity of the melt of the glass material. In this case, each of the intermediate layers 4 preferably has a thickness of about 2 μm to about 10 μm.

The glass material included in the base layers 2 may be vitrified before the firing step. Alternatively, the glass material may be formed by melting and vitrifying the glass component capable of being formed into the glass material in the firing step.

The glass material or the glass component capable of being melted and vitrified by firing to form the glass material is preferably crystallized, the glass material and the glass component being included in the base layers 2. Crystallized glass generally has high viscosity as compared to glass that is not crystallized. This may inhibit smooth diffusion or flow into the constraining layers 3. Furthermore, when the glass material included in the base layers 2 is crystallized, when the oxide of the transition element is used as the viscosity-reducing material, the oxide of the transition element cuts the cross-linking between oxygen atoms in the crystallized glass material that is in an unstable state, the viscosity is reduced once at the beginning. However, the resulting glass material that is more unstable is more easily crystallized, thereby disadvantageously facilitating the crystallization of the glass material.

The thickness of each of the base layers 2 is preferably set such that after the firing step, i.e., as a result of the behavior of the glass material in the firing step, contents of the glass material (residual amount after diffusion or flow into the constraining layers 3) of the base layers 2 between which the intermediate layer 4, the constraining layer 3 and the intermediate layer 4 are interposed are substantially the same per unit volume, the base layers 2 being adjacent in the stacking direction. In this preferred embodiment, more specifically, the base layers 2 disposed on both sides of each of the constraining layers 3 have substantially the same thickness.

As described above, since the base layers 2 is in a state in which the shrinkage in the direction of the main surface is inhibited by the constraining layers 3 and the shrinkage-constraining layers 12, relatively large shrinkage in the thickness direction occurs in the firing step. Also in the conductive films 5 to 7 and the via-hole conductors 8, shrinkage occurs because of the sintering of the conductive metal powder in the firing step. However, the rate of shrinkage of each of the conductive films 5 to 7 and the via-hole conductors 8 is less than that of each of the base layers 2 in the thickness direction. As a result, protrusions due to the via-hole conductors 8 may be undesirably formed in the multilayer ceramic substrate 1 after firing. In particular, when the via-hole conductors 8 are provided in the endmost base layers 2 in the stacking direction, the protrusions occur easily. The shrinkage-constraining layers 12 effectively inhibit the occurrence of the protrusions.

The shrinkage-constraining layers 12 are not sintered in the firing step. The unsintered shrinkage-constraining layers 12 are removed after the firing step. To facilitate the removal of the shrinkage-constraining layers 12, it may be preferable that the glass material penetrates into the shrinkage-constraining layers 12. Thus, in the green laminate 11, it is preferable that the intermediate layer 4 is not disposed between the base layer 2 and the shrinkage-constraining layer 12 and that the base layer 2 is in contact with the shrinkage-constraining layer 12. As described above, the absence of the intermediate layer 4 between the base layer 2 and the shrinkage-constraining layer 12 is useful when the conductive films 6 and 7 on the base layers 2 are formed.

The conductive films 6 and 7 disposed on the outer surfaces of the multilayer ceramic substrate 1 may be formed by firing the green laminate 11, removing the shrinkage-constraining layers 12, and applying and baking the conductive paste to the outer surfaces thereof.

According to need, the chip components 9 and 10 are mounted on the multilayer ceramic substrate 1, as shown in FIG. 1.

In the above-described multilayer ceramic substrate 1, the base layers 2, the constraining layers 3, and the intermediate layers 4 are composed of different materials from each other and usually have different thermal expansion coefficients from each other. In this case, when the fluidity of the glass component in the multilayer ceramic substrate 1 is lost in a cooling step after the firing step, a compressive stress remains in a layer having a smaller thermal expansion coefficient, and a tensile stress remains in a layer having a larger thermal expansion coefficient, among the base layers 2, the constraining layers 3 and the intermediate layers 4. In general, ceramic materials have low strength for the tensile stress as compared to that for the compressive stress. When the tensile stress reaches the critical strength, a structural defect, such as a crack, may occur. To solve these problems, preferably, the absolute value of the difference in thermal expansion coefficient between the base layer 2 and the intermediate layer 4 is about 2.0 ppm/° C. or less, and the absolute value of the difference in thermal expansion coefficient between the constraining layer 3 and the intermediate layer 4 is about 2.0 ppm/° C. or less.

To form the green laminate 11, the base layer 2, the constraining layer 3, and the intermediate layer 4 may be stacked layer by layer. Preferably, as described below, composite green sheets are prepared, and the green laminate 11 is formed with the composite green sheets.

FIGS. 3 to 7 show some examples of the composite green sheets. In FIGS. 3 to 7, elements that are equivalent to the elements shown in FIG. 2 are designated using the same reference numerals. Furthermore, in FIGS. 3 to 7, the conductive films and the via-hole conductors are not shown.

FIGS. 3 to 7 show a carrier film 15 composed of, for example, a polyethylene terephthalate. For example, the carrier film 15 is used when a ceramic slurry to be formed into the base layer 2 is formed into a sheet. Furthermore, the carrier film 15 facilitates the handling of the formed green sheet. The carrier film 15 is separated and removed after completion of a laminating step in order to form the green laminate 11.

Figure 3:
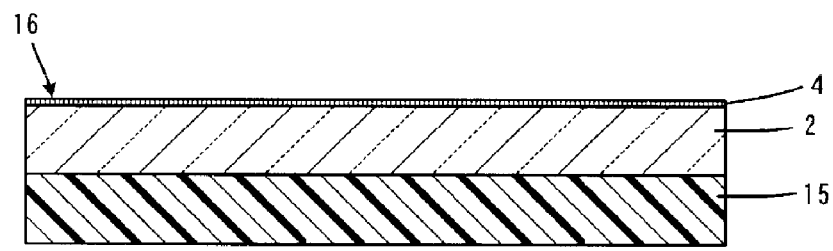
FIG. 3 is a cross-sectional view showing a first example of a composite green sheet used to form the green laminate.

A composite green sheet 16 shown in FIG. 3 is formed by forming a green sheet to be formed into the green base layer 2 on the carrier film 15, if necessary, drying the resulting green sheet, and forming a green sheet to be formed into the green intermediate layer 4 on the base layer 2. In the case of the composite green sheet 16, a conductive film (not shown) is easily formed on the intermediate layer 4.

The above-described formation of the green sheet to be formed into the base layer 2 and the formation of the green sheet to be formed into the intermediate layer 4 may be successively performed. Alternatively, after the formation of the green sheet to be formed into the base layer 2, the carrier film 5 holding the green sheet to be formed into the base layer 2 is wound into a roll. Then, the green sheet to be formed into the base layer 2 is drawn with the carrier film 15 from the roll, and the green sheet to be formed into the intermediate layer 4 may be formed. This is true for other composite green sheets 17 to 20 illustrated with reference to FIGS. 4 to 7.

Figure 4:
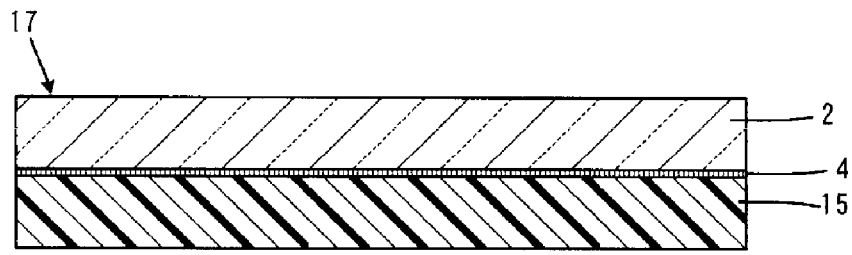
FIG. 4 is a cross-sectional view showing a second example of the composite green sheet used to form the green laminate.

The composite green sheet 17 shown in FIG. 4 is formed by forming a green sheet to be formed into the green intermediate layer 4 on the carrier film 15, if necessary, drying the green sheet, and forming a green sheet to be formed into the green base layer 2. In the case of the composite green sheet 17, a conductive film (not shown) is easily formed on the base layer 2.

The composite green sheet 16 shown in FIG. 3 and the composite green sheet 17 shown in FIG. 4 have the same laminated structure when the carrier films 15 are removed.

Figure 5:
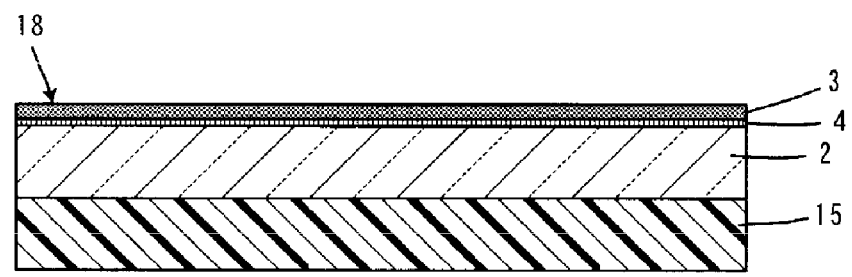
FIG. 5 is a cross-sectional view showing a third example of the composite green sheet used to form the green laminate.

The composite green sheet 18 shown in FIG. 5 is formed by forming a green sheet to be formed into the green base layer 2 on the carrier film 15, if necessary, drying the green sheet, forming a green sheet to be formed into the green intermediate layer 4 on the base layer 2, if necessary, drying the green sheet, and forming a green sheet to be formed into the green constraining layer 3 on the intermediate layer 4. In the case of the composite green sheets 18, a conductive film (not shown) is easily formed on the constraining layer 3.

Figure 6:
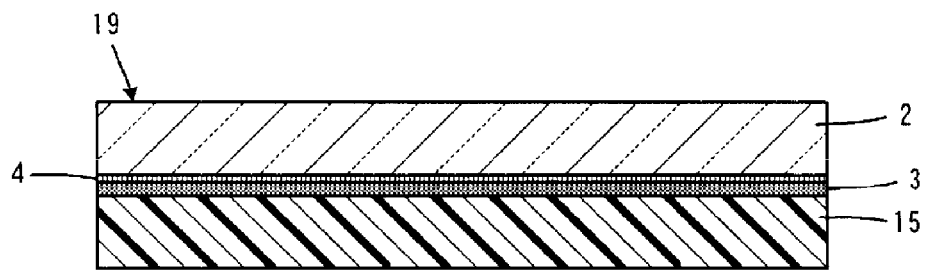
FIG. 6 is a cross-sectional view showing a fourth example of the composite green sheet used to form the green laminate.
Figure 7:
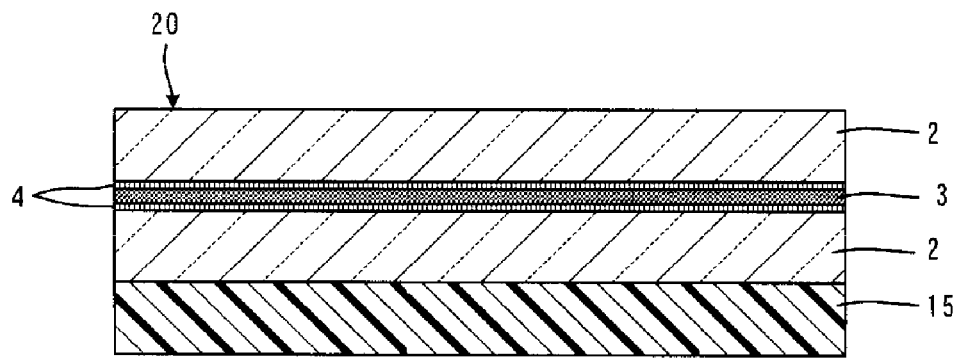
FIG. 7 is a cross-sectional view showing a fifth example of the composite green sheet used to form the green laminate.

The composite green sheet 19 shown in FIG. 6 is formed by forming a green sheet to be formed into the green constraining layer 3 on the carrier film 15, if necessary, drying the green sheet, forming a green sheet to be formed into the green intermediate layer 4 on the constraining layer 3, if necessary, drying the green sheet, and forming a green sheet to be formed into the green base layer 2 on the intermediate layer 4. In the case of the composite green sheet 19, a conductive film (not shown) is easily formed on the base layer 2.

The composite green sheets 18 shown in FIG. 5 and the composite green sheet 19 shown in FIG. 6 have the same laminated structure when the carrier films 15 are removed.

The composite green sheet 20 is formed by forming a green sheet to be formed into the green base layer 2 on the carrier film 15, forming a green sheet to be formed into the green intermediate layer 4, forming a green sheet to be formed into the green constraining layer 3, forming a green sheet to be formed into the green intermediate layer 4, and forming a green sheet to be formed into the green base layer 2 in that order. In the case of the composite green sheet 20, a conductive film (not shown) is easily formed on the base layer 2.

The composite green sheets 16 to 20 are used alone or in combination to form the green laminate 11. For example, the composite green sheet 16 or the composite green sheet 17 is combined with the composite green sheets 18 or the composite green sheet 19 to form the green laminate 11. Alternatively, a plurality of the composite green sheets 20 is stacked to form the green laminate 11.

Figure 8:
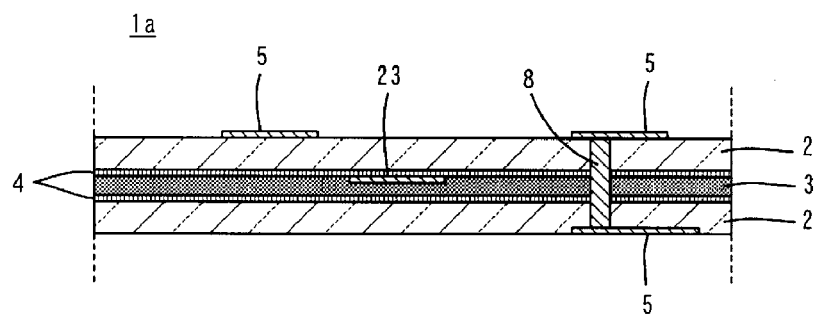
FIG. 8 is a cross-sectional view diagrammatically illustrating part of a multilayer ceramic substrate according to a second preferred embodiment of the present invention.

FIG. 8 is a cross-sectional view diagrammatically illustrating a multilayer ceramic substrate 1a according to a second preferred embodiment of the present invention. FIG. 8 shows a portion of the multilayer ceramic substrate 1a in the stacking direction. In FIG. 8, elements equivalent to the elements shown in FIG. 1 are designated using the same reference numerals, and the description thereof is omitted.

The multilayer ceramic substrate 1a shown in FIG. 8 includes a conductive film 23 that is provided along a main surface of the constraining layer 3 or the intermediate layer 4. As is apparent from this preferred embodiment, the conductive film may be formed along a main surface of any of the base layer 2, constraining layer 3, and the intermediate layer 4.

For example, when specific electromagnetic properties of the base layers 2 are utilized, the conductive films 5 are formed along main surfaces of the base layers 2. When specific electromagnetic properties of the constraining layer 3 is utilized, the conductive film 23 is formed along a main surface of the constraining layer 3. Thus, according to need, a powder having intended properties, i.e., electrical insulation properties, dielectric properties, piezoelectric properties, or magnetic properties, may be used as the first powder included in the base layers 2 or the second powder included in the constraining layer 3, thereby imparting a specific electromagnetic function to the multilayer ceramic substrate 1a.

Figure 9:
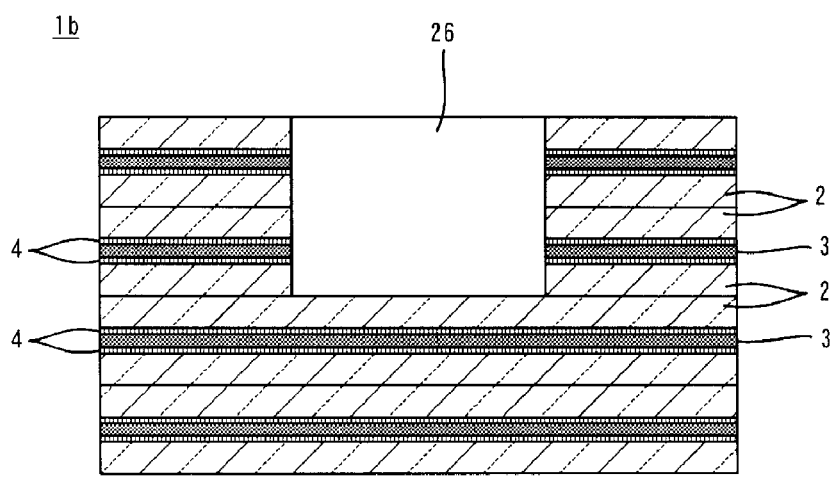
FIG. 9 is a cross-sectional view diagrammatically illustrating a multilayer ceramic substrate according to a third preferred embodiment of the present invention.

FIG. 9 is a cross-sectional view diagrammatically illustrating a multilayer ceramic substrate 1b according to a third preferred embodiment of the present invention. In FIG. 9, elements equivalent to the elements shown in FIG. 1 are designated using the same reference numerals, and the description thereof is omitted. In FIG. 9, wiring conductors such as conductive films and via-hole conductors are not shown.

The multilayer ceramic substrate 1b shown in FIG. 9 includes a cavity 26 having an opening positioned along one main surface thereof is provided. In the cavity 26, a chip component (not shown) is mounted. When the multilayer ceramic substrate 1b including the cavity 26 is produced, the cavity 26 is formed in a green laminate. Thus, when a plurality of green sheets is stacked in order to form the green laminate, through holes to be formed into the cavity 26 are formed in specific green sheets in advance.

When the green laminate including the cavity is fired, undesirable deformation often occurs. Thus, when the multilayer ceramic substrate 1b including the cavity 26 shown in FIG. 9 is produced, the deformation-inhibiting effect according to the present invention is particularly effectively exerted.

FIGS. 10 to 13 are each a cross-sectional view diagrammatically illustrating multilayer ceramic substrates 1c, 1d, 1e, and 1f according to a fourth to seventh preferred embodiments, respectively, of the present invention. The multilayer ceramic substrates 1c, 1d, 1e, and 1f shown in FIGS. 10 to 13 correspond to modifications of the multilayer ceramic substrate 1b including the cavity 26 shown in FIG. 9. In FIGS. 10 to 13, elements equivalent to the elements shown in FIG. 9 are designated using the same reference numerals, and the description thereof is omitted. Also in FIGS. 10 to 13, wiring conductors such as conductive films and via-hole conductors are not shown.

In a multilayer ceramic substrate including a cavity, a stress is caused by the shrinkage of a side wall portion surrounding the cavity and positioned at the upper portion of the bottom surface of the cavity and the shrinkage of a bottom wall portion positioned at the lower portion of the bottom surface of the cavity during firing. This results in the possibility of the occurrence of a defect, such as a crack, at the interface between the side wall portion and the bottom wall portion.

In each of the multilayer ceramic substrates 1c, 1d, 1e, and 1f shown in FIGS. 10 to 13, the constraining layer 3 is disposed along the interface between a side wall portion 27 and a bottom wall portion 28. The constraining layer 3 constrains the side wall portion 27 and the bottom wall portion 28 during firing to inhibit shrinkage thereof such that a crack or other defects are prevented from occurring.

Figure 10:
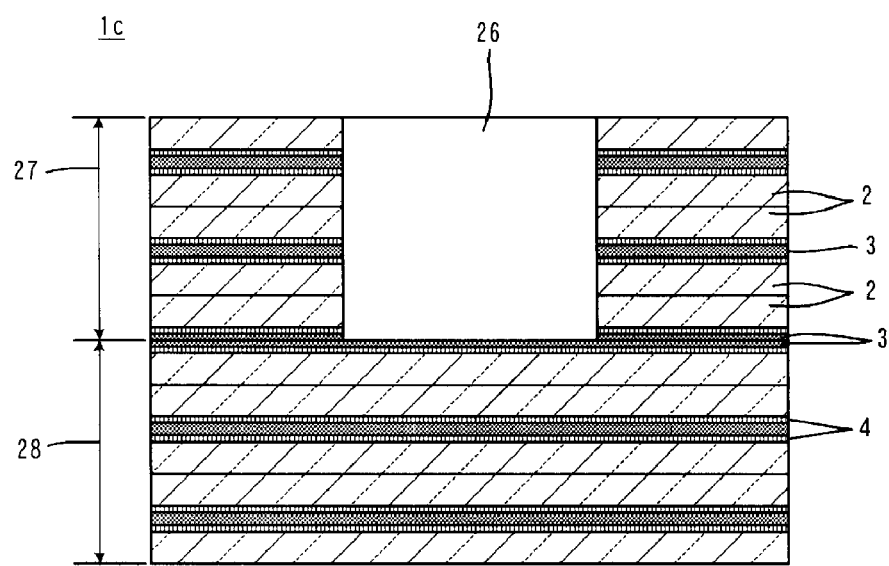
FIG. 10 is a cross-sectional view diagrammatically illustrating a multilayer ceramic substrate according to a fourth preferred embodiment of the present invention.

More specifically, in the multilayer ceramic substrate 1c shown in FIG. 10, the constraining layers 3 are disposed such that the bottom surface of the cavity 26 is defined by the constraining layer 3 and the constraining layer 3 is disposed on both sides of the interface between the side wall portion 27 and the bottom wall portion 28.

Figure 11:
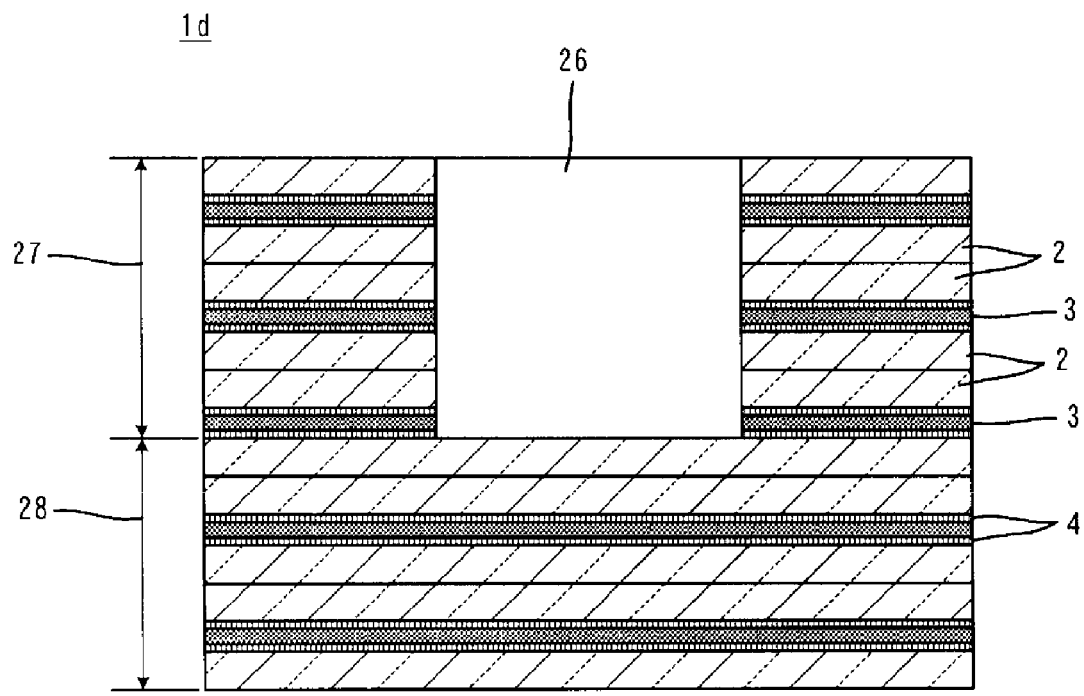
FIG. 11 is a cross-sectional view diagrammatically illustrating a multilayer ceramic substrate according to a fifth preferred embodiment of the present invention.

In the multilayer ceramic substrate 1d shown in FIG. 11, the bottom surface of the cavity 26 is defined by the base layer 2, and the constraining layer 3 is disposed at the side wall portion 27 and at a position adjacent to the bottom wall portion 28.

Figure 12:
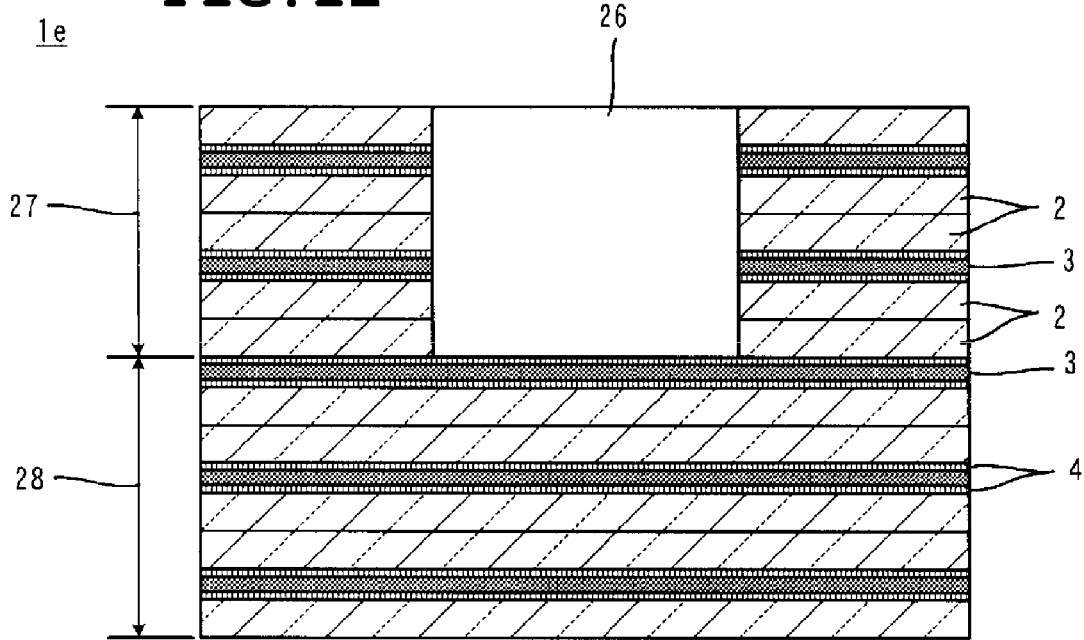
FIG. 12 is a cross-sectional view diagrammatically illustrating a multilayer ceramic substrate according to a sixth preferred embodiment of the present invention.

In the multilayer ceramic substrate 1e shown in FIG. 12, the bottom surface of the cavity 26 is defined by the intermediate layer 4, the constraining layer 3 is disposed at a position adjacent to the interface between the side wall portion 27 and the bottom wall portion 28.

Figure 13:
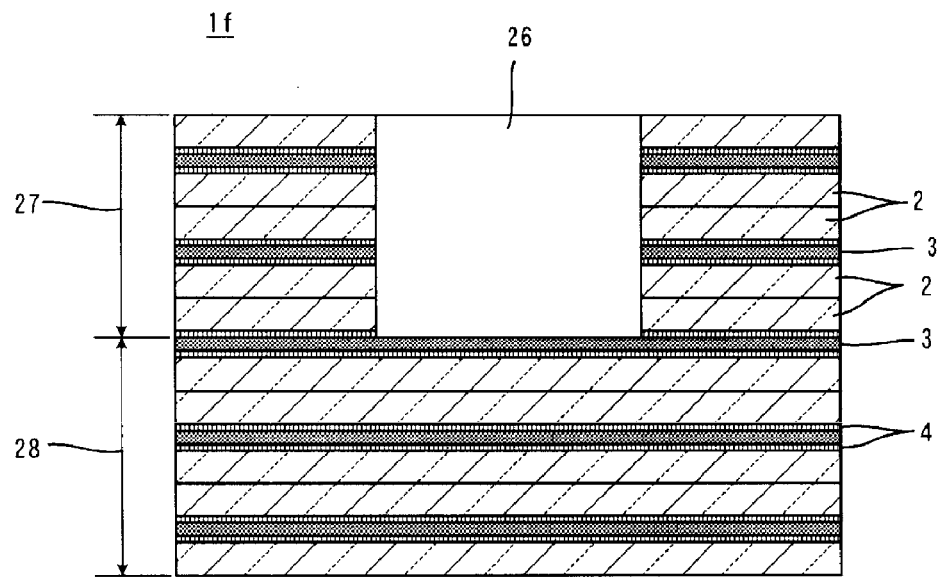
FIG. 13 is a cross-sectional view diagrammatically illustrating a multilayer ceramic substrate according to a seventh preferred embodiment of the present invention.

In the multilayer ceramic substrate 1f shown in FIG. 13, the constraining layer 3 is disposed such that the bottom surface of the cavity 26 is defined by the constraining layer 3.

Among the multilayer ceramic substrates 1c to 1f, in particular, in the multilayer ceramic substrate 1c shown in FIG. 10, the constraining layer 3 is disposed on each of the side wall portion 27 side and the bottom wall portion 28 side of the interface between the side wall portion 27 and the bottom wall portion 28, thus most effectively inhibiting the shrinkage.

EXAMPLES for verifying the effect according to the present invention will be described below.

EXPERIMENTAL EXAMPLE 1

1. Production of Sample

In this experimental example, samples 1 to 4 of multilayer ceramic substrates were produced.

(1) Sample 1

Figure 14A:
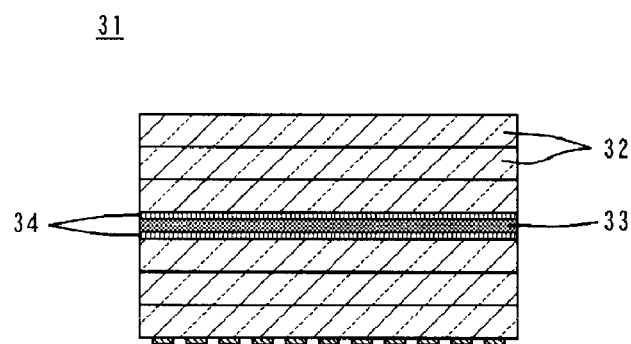
FIGS. 14A and 14B show a multilayer ceramic substrate according to each of Samples 1, 2, and 4 produced in Experimental Example 1.
Figure 14B:
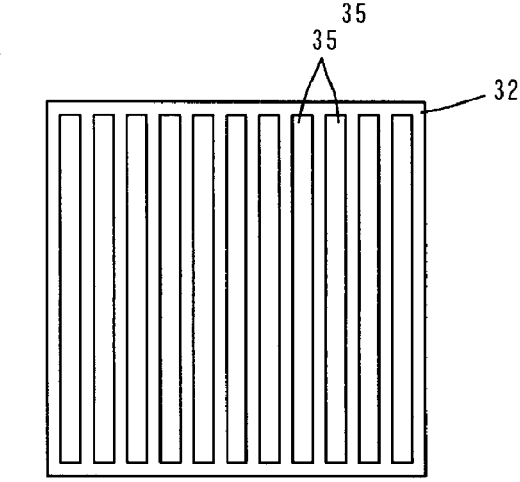

Sample 1 corresponds to an example within the scope of the present invention and has a structure shown in FIGS. 14A and 14B. FIG. 14A is an elevation view showing a cross section of a multilayer ceramic substrate 31, and FIG. 14B is a bottom plan view of the multilayer ceramic substrate 31. The multilayer ceramic substrate 31 includes base layers 32, a constraining layer 33, and intermediate layers 34. The multilayer ceramic substrate 31 includes three base layers 23 that are stacked on each side of the single constraining layer 33 with the single intermediate layer 34 provided therebetween. Furthermore, the multilayer ceramic substrate 31 includes a plurality of conductive films 35 extending on the bottom surface thereof, each of the conductive films 35 being in the form of strip.

Green sheets to be formed into the base layers 32 of the multilayer ceramic substrate 31 having the above-described structure were formed as described below. That is, 60 parts by weight of a $SiO_2$—CaO—$Al_2O_3$—MgO—$B_2O_3$ (37:15:27:5:16) glass powder which is not crystallized alone and has an average particle size of about 4 μm, 40 parts by weight of an alumina powder having an average particle size of about 0.35 μm, 50 parts by weight of water as a dispersion medium, 20 parts by weight of a polyvinyl alcohol as a binder, and 1 part by weight of a polycarboxylic acid dispersant as a dispersant were mixed to form a slurry. After defoaming the slurry, the slurry was formed into sheets by a doctor blade method, followed by drying to form the green sheets to be formed into the base layers 32, the resulting green sheets each having a thickness of about 30 μm.

A green sheet to be formed into the constraining layer 33 of the multilayer ceramic substrate 31 was formed as described below. That is, 100 parts by weight of an alumina powder having an average particle size of about 0.4 μm, 50 parts by weight of water as a dispersion medium, 20 parts by weight of a polyvinyl alcohol as a binder, and 1 part by weight of polycarboxylic acid dispersant as a dispersant were mixed to form a slurry. After defoaming the slurry, the slurry was formed into a sheet, followed by drying to form a green sheet to be formed into the constraining layer 33, the resulting green sheet having a thickness of about 10 μm.

Green sheets to be formed into the intermediate layers 34 of the multilayer ceramic substrate 31 were formed as described below. That is, 100 parts by weight of a copper oxide powder having an average particle size of about 1 μm, 50 parts by weight of water as a dispersion medium, 20 parts by weight of a polyvinyl alcohol as a binder, and 1 part by weight of polycarboxylic acid dispersant as a dispersant were mixed to form a slurry. After defoaming the slurry, the slurry was formed into sheets, followed by drying to form the green sheets to be formed into the intermediate layers 34, the resulting green sheets each having a thickness of about 4 μm.

The above-described green sheets were stacked and press-bonded to form green laminates for the multilayer ceramic substrates 31 shown in FIG. 14. The thickness of each of the green laminates was about 0.1 mm after firing. Each of the green laminates was cut so as to have a size of about 30 mm×about 30 mm.

On the other hand, a conductive paste for forming the conductive films 35 was prepared, the conductive paste including 48 parts by weight of a Ag powder having an average particle size of about 2 μm, 3 parts by weight of ethyl cellulose as a binder, and 49 parts by weight of terpenes as a solvent. The conductive paste was applied to the bottom surface of each of the green laminates in such a manner that the conductive films 35 were formed.

Each of the green laminates was fired at about 860° C., about 880° C., about 900° C., or about 920° C. each for about 20 minutes to form the multilayer ceramic substrates 31 according to Sample 1.

(2) Sample 2

Sample 2 corresponds to an example within the scope according to the present invention and has a structure shown in FIGS. 14A and 14B. In Sample 2, the multilayer ceramic substrate 31 was produced by the same method as that in Sample 1, except that the composition of the intermediate layers 34 of the multilayer ceramic substrate 31 was different from that in Sample 1.

Green sheets to be formed into the intermediate layers 34 were formed as described below. That is, 60 parts by weight of a $SiO_2$—CaO—$Al_2O_3$—MgO—$B_2O_3$ (36:13:24:2:24) glass powder having an average particle size of about 4 μm, 40 parts by weight of an alumina powder having an average particle size of about 0.35 μm, 50 parts by weight of water as a dispersion medium, 20 parts by weight of a polyvinyl alcohol as a binder, and 1 part by weight of a polycarboxylic acid dispersant as a dispersant were mixed to form a slurry. After defoaming the slurry, the slurry was formed into sheets by a doctor blade method, followed by drying to form the green sheets to be formed into the intermediate layers 34, the resulting green sheets each having a thickness of about 4 μm.

(3) Sample 3

Figure 15:
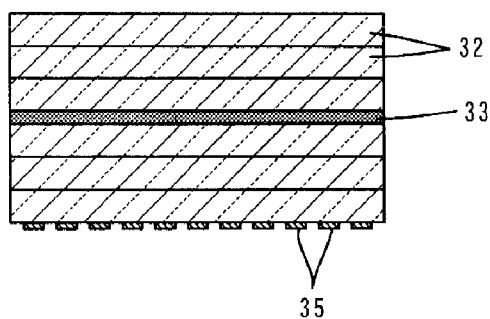
FIG. 15 is an elevation view showing a cross section of a multilayer ceramic substrate according to Sample 3 produced in Experimental Example 1.

Sample 3 corresponds to a comparative example outside the scope according to the present invention and has a structure shown in FIG. 15. In FIG. 15, elements equivalent to the elements shown in FIG. 14 are designated using the same reference numerals. A multilayer ceramic substrate 41 shown in FIG. 15 differs from the multilayer ceramic substrate 31 shown in FIG. 14 by the absence of the intermediate layer 34.

To form the multilayer ceramic substrate 41 having the structure shown in FIG. 15, the same green sheets to be formed into the base layers 32 and the constraining layer 33 and a conductive paste for forming the conductive films 35 were used as those in Sample 1 to form the multilayer ceramic substrate 41 according to Sample 3.

(4) Sample 4

Sample 4 is outside the preferred scope according to the present invention. The composition of green sheets to be formed into the base layers 32 differs from that in Sample 1.

The green sheets to be formed into the base layers 32 were formed as described below. That is, 50 parts by weight of a $SiO_2$—CaO—$Al_2O_3$—$B_2O_3$ (44:47:5:4) glass powder, which is a crystallized glass having wollastonite crystals, having an average particle size of about 2 μm, 50 parts by weight of an alumina powder having an average particle size of about 1.5 μm, 50 parts by weight of water as a dispersion medium, 20 parts by weight of a polyvinyl alcohol as a binder, and 1 part by weight of a polycarboxylic acid dispersant as a dispersant were mixed to form a slurry. After defoaming the slurry, the slurry was formed into sheets by a doctor blade method, followed by drying to form the green sheets to be formed into the base layers 32, the resulting green sheets each having a thickness of about 30 μm.

For the remainder, the multilayer ceramic substrates 31 according to Sample 4 were produced by the same method as that in Sample 1.

2. Evaluation

With respect to each of Samples 1 to 4, rates of shrinkage in the X-Y direction due to firing and coefficients of water absorption and warpage of the multilayer ceramic substrates were evaluated. These evaluations were performed for each sample obtained by firing at about 860° C., about 880° C., about 900° C., or about 920° C. Table 1 shows the evaluation results of the rates of shrinkage in the X-Y direction. Table 2 shows the evaluation results of the coefficients of water absorption. Table 3 shows the evaluation results of warpage.

TABLE 1

<<Rate of shrinkage in X-Y direction>>

| Sample | Firing temperature [° C.] | | | |
|---|---|---|---|---|
| | 860 | 880 | 900 | 920 |
| 1 | 0.4 | 0.4 | 0.4 | 0.5 |
| 2 | 0.4 | 0.5 | 0.5 | 0.5 |
| 3 | 0.4 | 0.4 | 0.4 | 0.4 |
| 4 | 0.4 | 0.4 | 0.5 | 0.4 |

TABLE 2

<<Coefficient of water absorption>>

| Sample | Firing temperature [° C.] | | | |
|---|---|---|---|---|
| | 860 | 880 | 900 | 920 |
| 1 | 0.1 | 0 | 0 | 0 |
| 2 | 0 | 0 | 0 | 0 |
| 3 | 0.5 | 0.3 | 0.1 | 0 |
| 4 | 0.8 | 0.5 | 0.3 | 0.3 |

TABLE 3

<<Warpage>>

| Sample | Firing temperature [° C.] | | | |
|---|---|---|---|---|
| | 860 | 880 | 900 | 920 |
| 1 | 11 | 26 | 42 | 65 |
| 2 | 12 | 24 | 43 | 68 |
| 3 | 12 | 25 | 41 | 70 |
| 4 | 10 | 26 | 32 | 58 |

As shown in Table 1, in each Sample, the rate of shrinkage in the X-Y direction due to firing was in the range of 0.4% to 0.5%. As shown in Table 3, in each Sample, a higher firing temperature resulted in a larger degree of warpage.

From a comparison of the coefficient of water absorbtion, the coefficient of water absorption of Sample 1 as an example was 0% at a firing temperature of 880° C. The coefficient of water absorption of Sample 2 was 0% at a firing temperature of 860° C. A coefficient of water absorption of 0% means that the glass material was smoothly penetrated into the constraining layer 33 to sufficiently densify the constraining layer 33.

In contrast, in Sample 3 as a comparative example, the coefficient of water absorption was 0% when the firing temperature was increased to 920° C. In Sample 4, which was within the present invention but outside the preferred scope, the coefficient of water absorption was not 0% at a firing temperature of 920° C. or less.

In particular, among Samples 1 to 3 which showed a coefficient of water absorption of 0% at a firing temperature, the warpage was compared. With respect to the warpage at the firing temperature at which a coefficient of water absorption of 0% was achieved, the warpage was 26 μm in Sample 1. The warpage was 12 μm in Sample 2. The warpage was 70 μm in Sample 3. The results demonstrate that Samples 1 and 2 each including the intermediate layers 34 can be fired at a temperature lower than that of Sample 3 not including the intermediate layer, thus reducing the warpage.

Sample 4 includes the intermediate layers 34 including copper oxide as the viscosity-reducing material, and the base layers 32 including crystallized glass. Therefore, it is found that the effect of copper oxide as the viscosity-reducing material was not effectively provided.

EXPERIMENTAL EXAMPLE 2

This experimental example was performed to determine the preferred relationship in thermal expansion coefficient between the base layer, the constraining layer, and the intermediate layer included in the multilayer ceramic substrate.

1. Production of Green Sheet (1) Green Sheet for Base Layer

First, 60 parts by weight of a $SiO_2$—BaO—$Al_2O_3$—$K_2O$—$B_2O_3$ (37:15:27:5:16) glass powder which is not crystallized alone and has an average particle size of about 4 μm, 40 parts by weight of an alumina powder having an average particle size of about 0.35 μm, 50 parts by weight of water as a dispersion medium, 20 parts by weight of a polyvinyl alcohol as a binder, and 1 part by weight of a polycarboxylic acid dispersant as a dispersant were mixed to form a slurry. After defoaming the slurry, the slurry was formed into sheets by a doctor blade method, followed by drying to form the green sheets to be formed into the base layers, the resulting green sheets each having a thickness of about 100 μm.

The thermal expansion coefficient (α1) of each of the green sheets for the base layers was found to be about 8.0 ppm/° C.

(2) Green Sheet for Constraining Layer

TABLE 4

| Symbol of constraining layer | Ceramic powder | Thermal expansion coefficient (α2) (ppm/° C.) |
| --- | --- | --- |
| R1 | $Al_2O_3$ | 5.2 |
| R2 | $TiO_2$ | 7.1 |
| R3 | $TiO_2$ + $La_2Ti_2O_7$(75:25) | 7.6 |
| R4 | $TiO_2$ + $La_2Ti_2O_7$(60:40) | 8.0 |
| R5 | $La_2Ti_2O_7$ | 10.3 |

As shown in Table 4, five types, i.e., R1 to R5, of green sheet for the constraining layer were formed.

In more detail, 100 parts by weight of any one of the ceramic powders shown in the column "Ceramic powder" of Table 4, 50 parts by weight of water as a dispersion medium, 20 parts by weight of a polyvinyl alcohol as a binder, and 1 part by weight of a polycarboxylic acid dispersant as a dispersant were mixed to form a slurry. After defoaming the slurry, the slurry was formed into sheets by a doctor blade method, followed by drying to form the green sheets to be formed into the constraining layers, the resulting green sheets each having a thickness of about 15 μm. The "[75:25]" and "[50:50]" described in the column "Ceramic powder" of constraining layers R3 and R4 in Table 4 each refer to the weight ratio of $TiO_2$ to $La_2Ti_2O_7$.

The thermal expansion coefficients of these green sheets R1 to R5 for the constraining layers after firing were found to be values shown in the column "Thermal expansion coefficient" of Table 4. In the green sheets for the constraining layers, the green sheet alone did not provide a densely sintered body. Thus, the thermal expansion coefficients shown in Table 4 were determined by calculating the amount of glass penetrated from the occupancy rate of gaps that were present between particles of the ceramic powder defining the constraining layer after firing and calculating the relationship between the amount of glass penetrated and the thermal expansion coefficient on the basis of a straight-line approximation.

(3) Green Sheet for Intermediate Layer

TABLE 5

| Symbol of intermediate layer | Ceramic powder | | Thermal expansion coefficient (α3) (ppm/° C.) |
| --- | --- | --- | --- |
| | Type | Content [wt %] | |
| B1 | — | 0 | 4.2 |
| B2 | $La_2Ti_2O_7$ | 15 | 6.0 |
| B3 | $La_2Ti_2O_7$ | 40 | 8.5 |
| B4 | $Al_2O_3$ | 40 | 4.9 |

As shown in Table 5, four types, i.e., B1 to B4, of green sheet for the intermediate layer were formed.

In more detail, 100 parts by weight of a mixed powder in which a $SiO_2$—CaO—$Al_2O_3$—MgO—$B_2O_3$ (36:13:24:2:24) glass powder having an average particle size of about 4 μm was mixed with any one of the ceramic powders, each having an average particle size of about 0.5 μm, shown in the column "Type" of the "Ceramic powder" in Table 5 in such a manner that the ceramic powder content was equal to the value shown in the column "Content", 50 parts by weight of water as a dispersion medium, 20 parts by weight of a polyvinyl alcohol as a binder, and 1 part by weight of a polycarboxylic acid dispersant as a dispersant were mixed to form a slurry. After defoaming the slurry, the slurry was formed into sheets by a doctor blade method, followed by drying to form the green sheets to be formed into the intermediate layers, the resulting green sheets each having a thickness of about 10 μm.

The thermal expansion coefficients of these green sheets B1 to B4 for the intermediate layers after firing had the values shown in the column "Thermal expansion coefficient" of Table 5.

2. Production of Multilayer Ceramic Substrate

Figure 16:
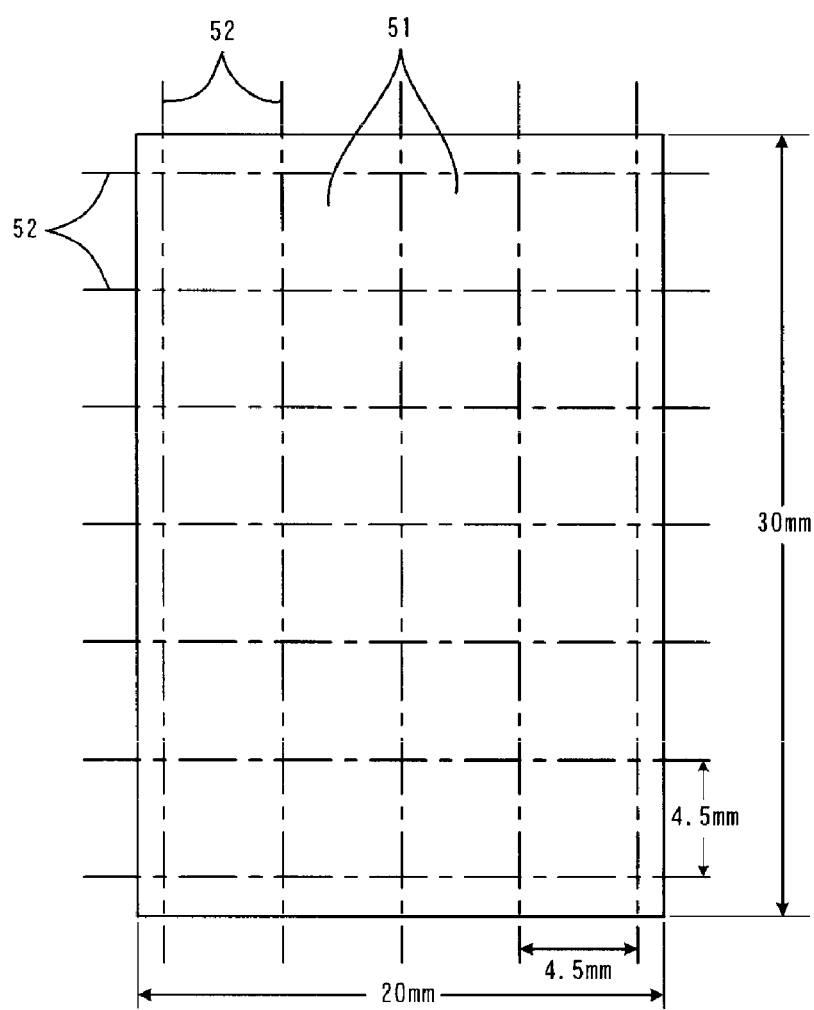
FIG. 16 is a plan view showing an appearance of an unseparated mother substrate for forming multilayer ceramic substrates 51 as samples in Experimental Example 2.
Figure 17A:
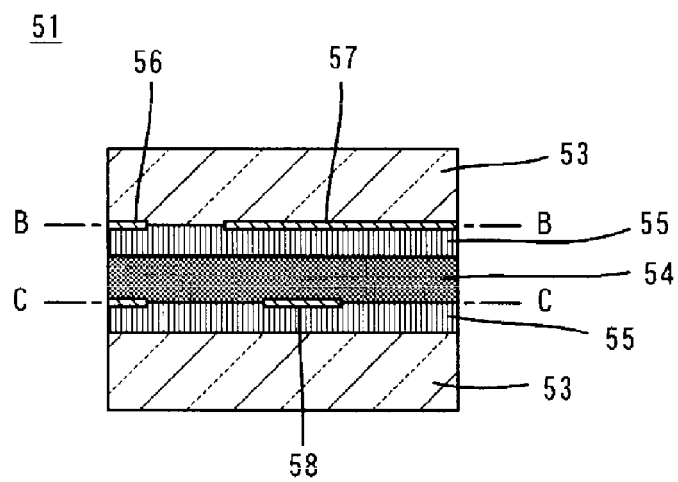
FIGS. 17A to 17C the multilayer ceramic substrates as the samples obtained by separating the mother substrate shown in FIG. 16.
Figure 17B:
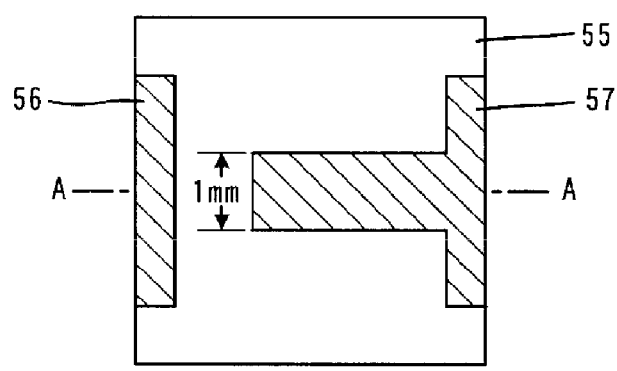
Figure 17C:
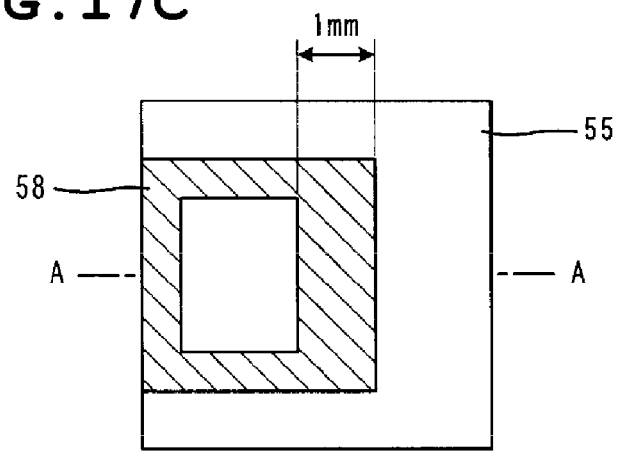

FIG. 16 is a plan view showing the appearance of a mother substrate 50 before separation, the mother substrate 50 being produced in order to form multilayer ceramic substrates 51 as samples. FIGS. 17A to 17C show the multilayer ceramic substrates 51 obtained by separating the mother substrate 50 shown in FIG. 16. FIG. 17A is a cross-sectional view taken along line A-A in FIGS. 17B or 17C, FIG. 17B is a cross-sectional view taken along line B-B shown in FIG. 17A, and FIG. 17C is a cross-sectional view taken along line C-C shown in FIG. 17A.

The multilayer ceramic substrates 51 shown in FIGS. 17A to 17C were obtained by separating the mother substrate 50 shown in FIG. 16 along separating lines 52. As shown in FIG. 16, the mother substrate 50 has a plan size of about 20 mm × about 30 mm. Each of the multilayer ceramic substrates 51 has a plan size of about 4.5 mm×about 4.5 mm.

As shown in FIGS. 17A to 17C, the multilayer ceramic substrates 51 includes a base layer 53, an intermediate layer 55, a constraining layer 54, the intermediate layer 55, and the base layer 53, disposed in that order from the top. Conductive films 56 and 57 each having a pattern shown in FIG. 17B are disposed along the interface between the base layer 53 and the intermediate layer 55. Furthermore, a conductive film 58 having a pattern shown in FIG. 17C is disposed along the interface between the center constraining layer 54 and the lower intermediate layer 55.

To obtain the multilayer ceramic substrates 51, the above-described green sheets for the base layers were used. As shown in the column "Symbol" in Table 6, any of the green sheets R1 to R5 for the constraining layers and any of the green sheets B1 to B4 for the intermediate layers were used. Furthermore, to form the conductive films 56 to 58, a conductive paste containing Ag/Pd (weight ratio=75:25) was used. Thereby, the green mother substrate 50 was obtained.

TABLE 6

| Sample | Constraining layer | | Intermediate layer | |
|---|---|---|---|---|
| | Symbol | α2[ppm/° C.] | Symbol | α3[ppm/° C.] |
| 11 | R1 | 5.2 | B1 | 4.2 |
| 12 | R1 | 5.2 | B2 | 6.0 |
| 13 | R2 | 7.1 | B1 | 4.2 |
| 14 | R2 | 7.1 | B2 | 6.0 |
| 15 | R3 | 7.6 | B1 | 4.2 |
| 16 | R3 | 7.6 | B4 | 4.9 |
| 17 | R3 | 7.6 | B2 | 6.0 |
| 18 | R3 | 7.6 | B3 | 8.5 |
| 19 | R4 | 8.0 | B1 | 4.2 |
| 20 | R4 | 8.0 | B4 | 4.9 |
| 21 | R4 | 8.0 | B2 | 6.0 |
| 22 | R4 | 8.0 | B3 | 8.5 |
| 23 | R5 | 10.3 | B1 | 4.2 |
| 24 | R5 | 10.3 | B4 | 4.9 |
| 25 | R5 | 10.3 | B2 | 6.0 |
| 26 | R5 | 10.3 | B3 | 8.5 |

In Table 6, the columns "Symbol" shown in the columns "Constraining layer" and "Intermediate layer" correspond to the "Symbol of constraining layer" shown in Table 4 and the "Symbol of intermediate layer" shown in Table 5. The column "α2" of the "Constraining layer" shown in Table 6 is transcribed from the column "Thermal expansion coefficient α2" of the constraining layer after firing shown in Table 4. The column "α3" of "Intermediate layer" is transcribed from the column "Thermal expansion coefficient α3" shown in Table 5.

The resulting green mother substrate 50 according to each Sample was fired at about 890° C. The rate of shrinkage in the X-Y direction was found to be in the range of about 0.4% to about 0.5% in any of the Samples 11 to 26.

The mother substrate 50 was separated along the separating lines 52 to form the multilayer ceramic substrates 51 according to Samples. The coefficients of water absorption of the multilayer ceramic substrates 51 were found to be 0% in any of Samples 11 to 26.

3. Evaluation of Withstand Voltage and Crack

The multilayer ceramic substrates 51 according to Samples 11 to 26 were each evaluated for a withstand voltage and the presence or absence of an internal crack. Table 7 shows the results. In the multilayer ceramic substrates 51 according to Samples, the opposite area between the conductive film 57 and the conductive film 58 was about 1 mm². The distance between the conductive film 57 and the conductive film 58 was about 15 μm.

TABLE 7

| Sample | α1-α3 [ppm/° C.] | α2-α3 [ppm/° C.] | Withstand voltage [kV] | Internal crack |
|---|---|---|---|---|
| 11 | 3.8 | 1.0 | 0.9 | Observed |
| 12 | 2.0 | −0.8 | >2 | None |
| 13 | 3.8 | 2.9 | 0.9 | Observed |
| 14 | 2.0 | 1.1 | 1.3 | None |
| 15 | 3.8 | 3.4 | 0.5 | Observed |
| 16 | 3.1 | 2.7 | 0.7 | Observed |
| 17 | 2.0 | 1.6 | 1.5 | None |
| 18 | −0.5 | −0.9 | >2 | None |
| 19 | 3.8 | 3.8 | 0.5 | Observed |
| 20 | 3.1 | 3.1 | 0.5 | Observed |
| 21 | 2.0 | 2.0 | 1.2 | None |
| 22 | −0.5 | −0.5 | 1.9 | None |
| 23 | 3.8 | 6.1 | 0.7 | Observed |
| 24 | 3.1 | 5.4 | 0.6 | Observed |
| 25 | 2.0 | 4.3 | 0.5 | Observed |
| 26 | −0.5 | 1.8 | 1.7 | None |

In Table 7, to facilitate the evaluation, the "α1-α3", i.e., the difference between the thermal expansion coefficient (α1) of the base layer 53 and the thermal expansion coefficient (α3) of the intermediate layer 55, and the "α2-α3", i.e., difference between the thermal expansion coefficient (α2) of the constraining layer 54 and the thermal expansion coefficient (α3) of the intermediate layer 55, are also shown.

As shown in Table 7, Samples 12, 14, 17, 18, 21, 22, and 26 in which the absolute value of each of the "α1-α3" and the "α2-α3" was 2.0 ppm/° C. or less had a withstand voltage of 1 kV or more. Furthermore, no cracks were observed in the multilayer ceramic substrates 51. The results demonstrate that order to achieve a high withstand voltage and the prevention of the occurrence of cracks, the absolute value of each of the "α1-α3" and the "α2-α3" is preferably about 2.0 ppm/° C. or less.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic substrate comprising:
   a base layer made of an aggregate of a first powder including a glass material and a first ceramic material;
   a constraining layer made of an aggregate of a second powder including a second ceramic material that is not sintered at a temperature at which the glass material melts;
   an intermediate layer made of an aggregate of a third powder including a viscosity-reducing material that reduces the viscosity of the melt of the glass material; and
   a conductive film disposed along at least one main surface of the base layer, the constraining layer, and the intermediate layer; wherein
   the intermediate layer is arranged such that one main surface thereof is in contact with the base layer and the other main surface thereof is in contact with the constraining layer;

the intermediate layer has a thickness of about 2 μm to about 10 μm;
at least a portion of the first powder is in a sintered state; and
the second powder is in an unsintered state, and particles of the second powder are bonded to each other by diffusion or flow of a portion of the first powder including the glass material and a portion of the third powder into the constraining layer.

2. The multilayer ceramic substrate according to claim 1, wherein the viscosity-reducing material includes an oxide of a transition element.

3. The multilayer ceramic substrate according to claim 1, wherein the viscosity-reducing material includes at least one of a low-viscosity glass material and a low-melting-point glass material.

4. The multilayer ceramic substrate according to claim 1, wherein the portion of the glass material included in the base layer diffuses or flows into the entirety of the constraining layer, and all of the particles of the second powder are bonded to each other by the portion of the glass material.

5. The multilayer ceramic substrate according to claim 1, wherein the glass material includes a vitrified portion before sintering at least a portion of the first powder.

6. The multilayer ceramic substrate according to claim 1, wherein the glass material includes a portion melted and vitrified through sintering at least a portion of the first powder.

7. The multilayer ceramic substrate according to claim 1, wherein the glass material is not crystallized.

8. The multilayer ceramic substrate according to claim 1, wherein the multilayer ceramic substrate includes a plurality of the base layers and has a laminated structure portion in which the intermediate layer, the constraining layer, and the intermediate layer are stacked in that order, each being disposed between adjacent base layers in the stacking direction.

9. The multilayer ceramic substrate according to claim 8, wherein contents of the glass material of the base layers between which the intermediate layer, the constraining layer, and the intermediate layer are interposed are substantially the same per unit volume, the base layers being adjacent in the stacking direction.

10. The multilayer ceramic substrate according to claim 1, wherein the multilayer ceramic substrate includes a plurality of constraining layers and has a laminated structure portion in which the intermediate layer, the base layer, and the intermediate layer are stacked in that order, each being disposed between adjacent constraining layers in the stacking direction.

11. The multilayer ceramic substrate according to claim 1, wherein the constraining layer has a thickness less than that of the base layer.

12. The multilayer ceramic substrate according to claim 1, further comprising a cavity having an opening positioned at least along one main surface of the multilayer ceramic substrate.

13. The multilayer ceramic substrate according to claim 1, wherein an absolute value of a difference in thermal expansion coefficient between the base layer and the intermediate layer is about 2.0 ppm/° C. or less, and an absolute value of a difference in thermal expansion coefficient between the constraining layer and the intermediate layer is about 2.0 ppm/° C. or less.

* * * * *